United States Patent
Du

(10) Patent No.: US 7,652,909 B2
(45) Date of Patent: Jan. 26, 2010

(54) 2T/2C FERROELECTRIC RANDOM ACCESS MEMORY WITH COMPLEMENTARY BIT-LINE LOADS

(75) Inventor: Xiao Hong Du, Colorado Springs, CO (US)

(73) Assignee: Ramtron International Corporation, Colorado Springs, CO (US)

( * ) Notice: Subject to any disclaimer, the term of this patent is extended or adjusted under 35 U.S.C. 154(b) by 270 days.

(21) Appl. No.: 11/875,922

(22) Filed: Oct. 21, 2007

(65) Prior Publication Data

US 2009/0103348 A1   Apr. 23, 2009

(51) Int. Cl.
   *G11C 11/22*   (2006.01)
   *G11C 5/06*   (2006.01)
(52) U.S. Cl. ............................. 365/145; 365/65
(58) Field of Classification Search ............... 365/145, 365/63, 65
   See application file for complete search history.

(56) References Cited

U.S. PATENT DOCUMENTS

| | | | |
|---|---|---|---|
| 4,873,664 A | 10/1989 | Eaton, Jr. | |
| 6,028,782 A * | 2/2000 | Hirano et al. | ............... 365/145 |
| 6,151,242 A * | 11/2000 | Takashima | ............... 365/145 |
| 6,680,861 B2 * | 1/2004 | Kasai | ............... 365/145 |

OTHER PUBLICATIONS

Ramtron; "Preliminary FM1105 Nonvolatile 5V Dual State Saver"; Ramtron International Corporation; Rev. 1.0; May 2007; pp. 1-8; Colorado Springs, CO US.

Ramtron; "FM1106 Nonvolatile 3V Dual State Saver"; Ramtron International Corporation; Rev. 1.0; May 2007; pp. 1-8; Colorado Springs, CO US.

Ramtron; "FM1107 Nonvolatile 3V Dual State Saver"; Ramtron International Corporation; Rev. 1.0; May 2007; pp. 1-8; Colorado Springs, CO US.

Ramtron; "Preliminary FM1110 Nonvolatile 5V Quad State Saver"; Ramtron International Corporation; Rev. 1.0; Aug. 2007; pp. 1-8; Colorado Springs, CO US.

(Continued)

*Primary Examiner*—Ly D Pham
(74) *Attorney, Agent, or Firm*—Hogan & Hartson LLP

(57) ABSTRACT

The signal margin of a small array 2T/2C memory is increased by writing the ferroelectric load capacitors on the bit lines to complementary states. A ferroelectric memory array includes rows and columns of 2T/2C memory cells, wherein each column of the memory array includes a first memory subcell having a first node coupled to a word line, a second node coupled to a first bit line, and a third node coupled to a first plate line, the first memory cell being poled in a first direction; a second memory subcell having a first node coupled to the word line, a second node coupled to a second bit line, and a third node coupled to the first plate line, the second memory cell being poled in a second direction; a first load subcell having a first node coupled to the word line, a second node coupled to the first bit line, and a third node coupled to a second plate line, the first load cell being poled in the first direction; and a second load subcell having a first node coupled to the word line, a second node coupled to a second bit line, and a third node coupled to the second plate line, the second load cell being poled in the second direction.

20 Claims, 2 Drawing Sheets

OTHER PUBLICATIONS

Ramtron; "FM1112 Nonvolatile 3V Quad State Saver"; Ramtron International Corporation; Rev. 1.0; Aug. 2007; pp. 1-8; Colorado Springs, CO US.

Ramtron; "FM1114 Nonvolatile 3V Quad State Saver"; Ramtron International Corporation; Rev. 1.0; Aug. 2007; pp. 1-8; Colorado Springs, CO US.

* cited by examiner

2T/2C FERROELECTRIC RANDOM ACCESS MEMORY WITH COMPLEMENTARY BIT-LINE LOADS

BACKGROUND OF THE INVENTION

The present invention relates to ferroelectric memories, and more specifically to a circuit and method for increasing the signal margin of small 2T/2C ferroelectric memories in order to improve retention.

In existing 2T/2C FRAM® structures, the same load capacitances are designated to all of the bit lines. For large array size memory, parasitic capacitances contribute most of the bit line loads and all the bit lines have almost equal capacitive loads. However, for small 2T/2C FRAM memories, the parasitic capacitances on the bit lines are not large enough and extra capacitors are added to the bit lines to optimize the signal margin during a read operation. One of the existing techniques for increasing signal margin is to add linear ferroelectric capacitors to the bit lines to save area and to balance the capacitance load between a bit line (BL) and its complementary bit line (BLB). Since the dielectric constant of ferroelectric materials is much higher than that of silicon dioxide, the capacitor size using ferroelectric materials is much smaller than conventional capacitors using silicon dioxide.

The problem with this existing solution is that it does not fully exploit the advantage of using ferroelectric capacitors. What is desired is a circuit and method for increasing the signal margin of small array ferroelectric memories, while overcoming the problems associated with prior art solutions and also fully realizing the potential of using ferroelectric capacitors.

SUMMARY OF THE INVENTION

According to the present invention, the signal margin of a small array 2T/2C memory can be further increased by writing the ferroelectric load capacitors on BL and BLB to complementary states, instead of keeping both of the ferroelectric load capacitors always in the linear portion as is done in the prior art.

According to an embodiment of the present invention, a ferroelectric memory array includes a plurality of rows and columns of 2T/2C memory cells, wherein each column of the memory array includes a first memory subcell having a first node coupled to a word line, a second node coupled to a first bit line, and a third node coupled to a first plate line, the first memory cell being poled in a first direction; a second memory subcell having a first node coupled to the word line, a second node coupled to a second bit line, and a third node coupled to the first plate line, the second memory cell being poled in a second direction; a first load subcell having a first node coupled to the word line, a second node coupled to the first bit line, and a third node coupled to a second plate line, the first load cell being poled in the first direction; and a second load subcell having a first node coupled to the word line, a second node coupled to a second bit line, and a third node coupled to the second plate line, the second load cell being poled in the second direction. The correspondence of the poling between the cells remains the same throughout the operation of the memory, even if the poling may switch (between upward and downward) with the state of the data (one and zero) stored in the memory cells.

The foregoing and other objects, features and advantages of the invention will become more readily apparent from the following detailed description of a preferred embodiment of the invention, which proceeds with reference to the accompanying drawings.

DETAILED DESCRIPTION

Figure 1:
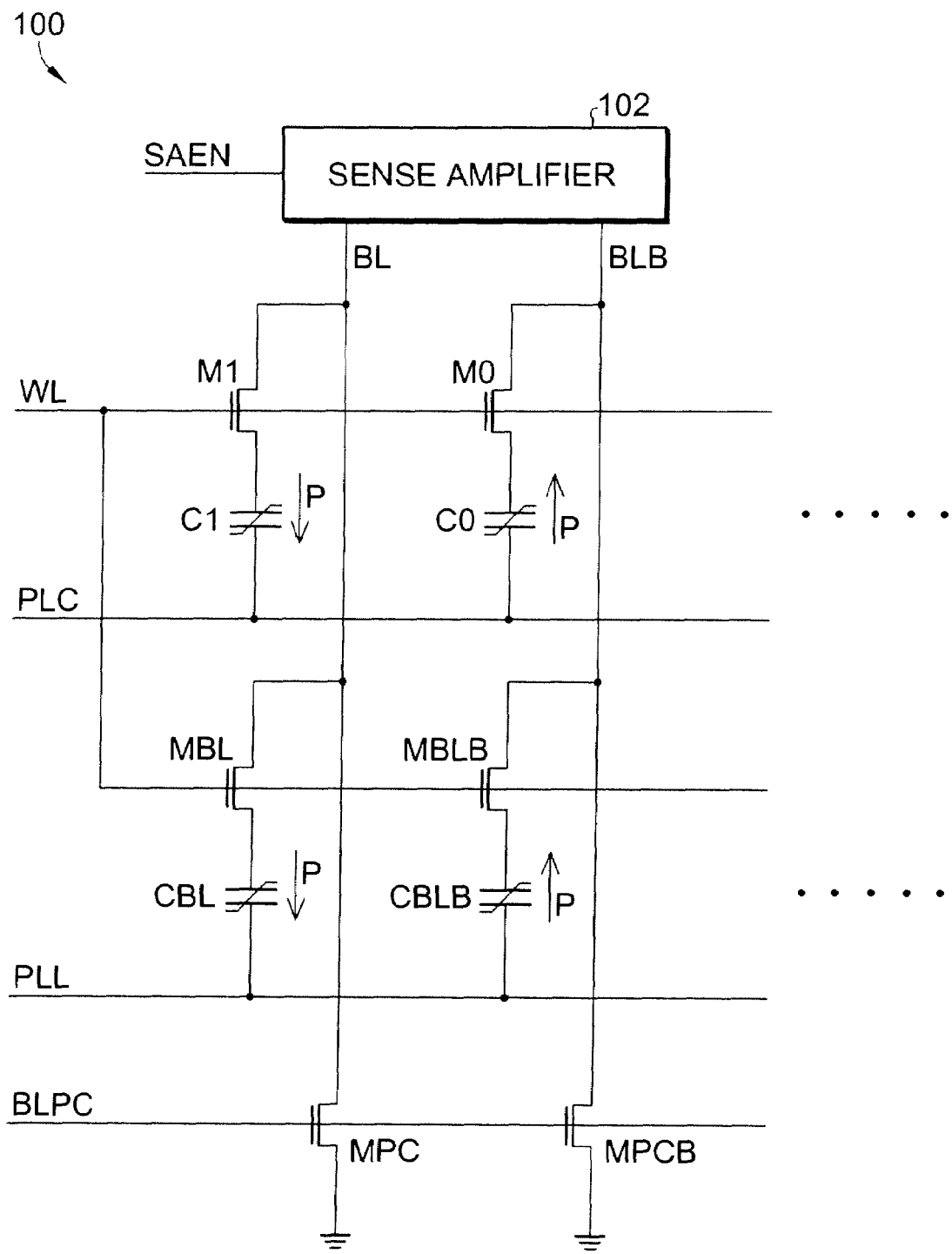
FIG. 1 is a circuit diagram of a portion of a 2T/2C ferroelectric memory according to the present invention.
Figure 2:
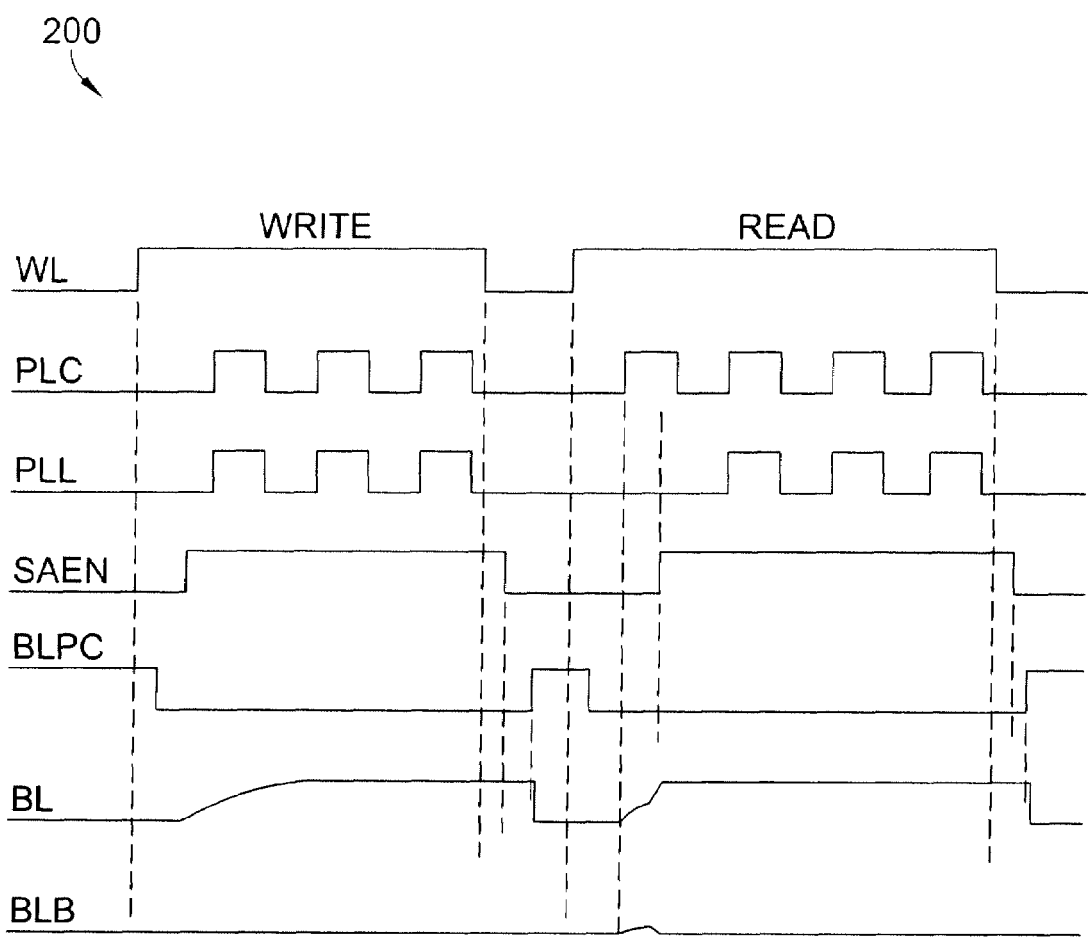
FIG. 2 is a timing diagram showing the various control signals associated with the memory of FIG. 1.

FIG. 1 shows a schematic diagram for a memory circuit 100 according to the present invention, and FIG. 2 shows the control timing diagram 200 used for write and read operations. Referring to FIG. 1, capacitors C1 and C0 are a pair of ferroelectric capacitors as are typically used in existing standard 2T/2C ferroelectric memory cells. The difference between the memory circuit 100 of the present invention and a prior art memory circuit is in the nature of the load capacitors CBL and CBLB. In FIG. 1, there are shown a pair of ferroelectric load capacitors CBL and CBLB which are coupled to the bit lines BL and BLB in the same way as the ferroelectric cell capacitors C1 and C0. Also, all the access devices M1 and M0 for the cell capacitors C1 and C2 and MBL and MBLB for the load capacitors CBL and CBLB are controlled by the same word line signal WL. But it is important to note that the plate lines PLC and PLL are controlled separately by two separate control signals. In addition to the 2T/2C memory cell, and the 2T/2C load cell, circuit 100 includes a sense amplifier 102 coupled to the bit lines BL and BLB, which is controlled by a sense amplifier control signal SAEN. The sense amplifier 102 resolves the charge on bit lines BL and BLB into valid logic levels once it is enabled. Memory circuit 100 also includes precharge transistors MPC and MPCB coupled to bit lines BL and BLB. Precharge transistors are each controlled by the BLPC precharge control signal.

While a 1×N array implementation is shown in FIG. 1, which is appropriate for a small nonvolatile memory, the array can be extended to include more than one row in a column. In an extended array implementation, all of the elements shown (except for the sense amplifier) are repeated. However, the maximum efficiency is realized for the small array structure shown in FIG. 1.

Referring now to FIG. 2, a write operation is started with the word line signal WL high, and then the bit line precharge devices MPC and MPCB are turned off when control signal BLPC goes low. At this time, the 2T/2C cell and the load capacitors CBL and CBLB are coupled to bit lines BL and BLB. After the sense amplifier 102 is turned on when sense amplifier control signal SAEN is high, the input data is latched and bit lines BL and BLB are driven to the desired states, for example, a logic one on BL and a logic zero on BLB, as shown in FIG. 1. Then, the same pulses are applied on both PLC and PLL plate lines to write the ferroelectric cell and load capacitors on the same bit line to the same state. As shown in FIG. 1, both ferroelectric capacitors C1 and CBL are poled downwards and both ferroelectric capacitors C0 and CBLB are poled upwards. (It is important to note that the exact polarization state shown in FIG. 1 is only an example for one of two cases. When the data state is changed, the polarization will change to the opposite direction. The alignments of the capacitor polarizations, one to the other, will remain the same however even if the direction is changed.) After several plate line pulses, the word line WL goes low, and the sense amplifier control signal SAEN is turned off, and bit line precharge signal BLPC goes high to end the write access. A read access is also started with the word line control signal WL going high, but the plate lines for the cell and the load are controlled differently during a read operation. After the word lines are turned on and the bit line pre-charge devices are off, the plate line PLC for the cell capacitors goes high while the plate line PLL for the load capacitors is kept low. Referring to FIG. 1, when plate line signal PLC becomes high, capacitor C1 outputs switch charges Q1 to bit line BL and capacitor C0 outputs non-switch charges Q0 to complementary bit line BLB. The ferroelectric capacitors have a memory function because a switch term Q1 is larger than a non-switch term Q0. If the bit line loads on BL and BLB were the same, then the voltage difference between BL and BLB would be proportional to the difference between Q1 and Q0. Actually, this is the case in standard 2T/2C FRAM memory circuits. However, in the circuit and method of the present invention load capacitors CBL and CBLB are poled in the opposite directions when data is written to the cell. Thus, the capacitance value of capacitor CBL is smaller than the capacitance value of capacitor CBLB in FIG. 1. In other words, Q1 is charged to a smaller load capacitor and Q0 is charged to a larger load capacitor. As a result, the voltage difference between bit lines BL and BLB is larger than that in a standard 2T/2C FRAM memory where the load capacitors for bit lines BL and BLB are the same. After the sense amplifier 102 is turned on and the data states on the bit lines BL and BLB are resolved, the data states are written back to the cell and the load capacitors by applying several plate pulses on both PLC and PLL, which is the same as a write access.

Having described and illustrated the principle of the invention in a preferred embodiment thereof, it is appreciated by those having skill in the art that the invention can be modified in arrangement and detail without departing from such principles. Although a preferred method and circuit has been shown, the exact details of the preferred method and circuit can be changed as desired as required for a particular application. We therefore claim all modifications and variations coming within the spirit and scope of the following claims.

I claim:

1. A 2T/2C ferroelectric memory cell and load thereof comprising:
    a first memory subcell having a first node coupled to a word line, a second node coupled to a first bit line, and a third node coupled to a first plate line, the first memory cell being poled in a first direction;
    a second memory subcell having a first node coupled to the word line, a second node coupled to a second bit line, and a third node coupled to the first plate line, the second memory cell being poled in a second direction;
    a first load subcell having a first node coupled to the word line, a second node coupled to the first bit line, and a third node coupled to a second plate line, the first load cell being poled in the first direction; and
    a second load subcell having a first node coupled to the word line, a second node coupled to a second bit line, and a third node coupled to the second plate line, the second load cell being poled in the second direction.

2. The 2T/2C ferroelectric memory cell of claim 1 wherein the first memory subcell and the second memory subcell each comprise a transistor coupled to a ferroelectric capacitor.

3. The 2T/2C ferroelectric memory cell of claim 1 wherein the first load subcell and the second load subcell each comprise a transistor coupled to a ferroelectric capacitor.

4. The 2T/2C ferroelectric memory cell of claim 1 further comprising a sense amplifier coupled to the first and second bit lines.

5. The 2T/2C ferroelectric memory cell of claim 4 wherein the sense amplifier receives a sense amplifier enable signal.

6. The 2T/2C ferroelectric memory cell of claim 1 further comprising first and second precharge transistors respectively coupled to the first and second bit lines.

7. The 2T/2C ferroelectric memory cell of claim 6 wherein the first and second precharge transistors each receive a pre-charge control signal.

8. A 2T/2C ferroelectric memory array comprising a plurality of rows and columns of 2T/2C memory cells, wherein each column of the memory array comprises:
    a first memory subcell having a first node coupled to a word line, a second node coupled to a first bit line, and a third node coupled to a first plate line, the first memory cell being poled in a first direction;
    a second memory subcell having a first node coupled to the word line, a second node coupled to a second bit line, and a third node coupled to the first plate line, the second memory cell being poled in a second direction;
    a first load subcell having a first node coupled to the word line, a second node coupled to the first bit line, and a third node coupled to a second plate line, the first load cell being poled in the first direction; and
    a second load subcell having a first node coupled to the word line, a second node coupled to a second bit line, and a third node coupled to the second plate line, the second load cell being poled in the second direction.

9. The 2T/2C ferroelectric memory array of claim 8 wherein the first memory subcell and the second memory subcell each comprise a transistor coupled to a ferroelectric capacitor.

10. The 2T/2C ferroelectric memory array of claim 8 wherein the first load subcell and the second load subcell each comprise a transistor coupled to a ferroelectric capacitor.

11. The 2T/2C ferroelectric memory array of claim 8 further comprising a sense amplifier coupled to the first and second bit lines.

12. The 2T/2C ferroelectric memory array of claim 11 wherein the sense amplifier receives a sense amplifier enable signal.

13. The 2T/2C ferroelectric memory array of claim 8 further comprising first and second precharge transistors respectively coupled to the first and second bit lines.

14. The 2T/2C ferroelectric memory array of claim 13 wherein the first and second precharge transistors each receive a precharge control signal.

15. A method of operating a 2T/2C memory comprising:
    providing a 2T/2C memory cell coupled to a word line, a first bit line, a second bit line, and a first plate line;
    poling a ferroelectric capacitor associated with the first bit line in the 2T/2C memory cell in a first direction;
    poling a ferroelectric capacitor associated with the second bit line in the 2T/2C memory cell in a second direction;
    providing a 2T/2C load cell coupled to the word line, the first bit line, the second bit line, and a second plate line;
    poling a ferroelectric capacitor associated with the first bit line in the 2T/2C load cell in the first direction; and
    poling a ferroelectric capacitor associated with the second bit line in the 2T/2C load cell in the second direction.

16. The method of claim 15 further comprising multiply pulsing the first and second plate lines during a write mode of operation.

17. The method of claim 15 further comprising multiply pulsing the first and second plate lines during a read mode of operation.

18. The method of claim 15 further comprising sensing the charge on the first and second bit lines.

19. The method of claim 15 further comprising precharging the first and second bit lines.

20. A ferroelectric memory comprising:
- a 2T/2C memory cell having first ferroelectric capacitor and second ferroelectric capacitor, said first and second ferroelectric capacitor being oppositely poled; and
- a 2T/2C load cell having third ferroelectric capacitor and fourth ferroelectric capacitor, said third and fourth ferroelectric capacitors being oppositely poled, wherein the first and third ferroelectric capacitors are associated with a first bit line and are similarly poled, and the second and fourth ferroelectric capacitors are associated with a second bit line and are similarly poled.

* * * * *

UNITED STATES PATENT AND TRADEMARK OFFICE
CERTIFICATE OF CORRECTION

PATENT NO. : 7,652,909 B2 Page 1 of 1
APPLICATION NO. : 11/875922
DATED : January 26, 2010
INVENTOR(S) : Xiao Hong Du It is certified that error appears in the above-identified patent and that said Letters Patent is hereby corrected as shown below:

Please amend claim 1 beginning at col. 3, line 39 as follows:

1.  A 2T/2C ferroelectric memory cell and load thereof comprising:
a first memory subcell having a first node coupled to a word line, a second node coupled to a first bit line, and a third node coupled to a first plate line, the first memory subcell being poled in a first direction;
a second memory subcell having a first node coupled to the word line, a second node coupled to a second bit line, and a third node coupled to the first plate line, the second memory subcell being poled in a second direction;
a first load subcell having a first node coupled to the word line, a second node coupled to the first bit line, and a third node coupled to a second plate line, the first load subcell being poled in the first direction; and
a second load subcell having a first node coupled to the word line, a second node coupled to a second bit line, and a third node coupled to the second plate line, the second load subcell being poled in the second direction.

Please amend claim 8 beginning at col. 4, line 7, as follows:

8.  A 2T/2C ferroelectric memory array comprising a plurality of rows and columns of 2T/2C memory cells, wherein each column of the memory array comprises:
a first memory subcell having a first node coupled to a word line, a second node coupled to a first bit line, and a third node coupled to a first plate line, the first memory subcell being poled in a first direction;
a second memory subcell having a first node coupled to the word line, a second node coupled to a second bit line, and a third node coupled to the first plate line, the second memory subcell being poled in a second direction;
a first load subcell having a first node coupled to the word line, a second node coupled to the first bit line, and a third node coupled to a second plate line, the first load subcell being poled in the first direction; and
a second load subcell having a first node coupled to the word line, a second node coupled to a second bit line, and a third node coupled to the second plate line, the second load subcell being poled in the second direction.

Signed and Sealed this

Sixth Day of April, 2010

David J. Kappos
*Director of the United States Patent and Trademark Office*